United States Patent
Tang et al.

(10) Patent No.: US 10,338,621 B1
(45) Date of Patent: Jul. 2, 2019

(54) VOLTAGE REGULATOR IN USB POWER DELIVERY INTEGRATED CIRCUIT

(71) Applicant: TEXAS INSTRUMENTS INCORPORATED, Dallas, TX (US)

(72) Inventors: Nghia Trong Tang, Dallas, TX (US); Byungchul Brandon Jang, Allen, TX (US); Timothy Bryan Merkin, Princeton, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/127,948

(22) Filed: Sep. 11, 2018

(51) Int. Cl.
| | |
|---|---|
| *G06F 13/36* | (2006.01) |
| *G05F 1/575* | (2006.01) |
| *H02M 3/156* | (2006.01) |
| *G06F 13/38* | (2006.01) |
| *G05F 1/648* | (2006.01) |
| *G06F 1/26* | (2006.01) |
| *H03K 19/0185* | (2006.01) |
| *H02M 1/00* | (2006.01) |

(52) U.S. Cl.
CPC .............. *G05F 1/575* (2013.01); *G05F 1/648* (2013.01); *G06F 1/266* (2013.01); *G06F 13/385* (2013.01); *H02M 3/156* (2013.01); *H03K 19/0185* (2013.01); *G06F 2213/0042* (2013.01); *H02M 2001/0032* (2013.01)

(58) Field of Classification Search
CPC .................. G05F 1/575; H02M 3/156; H02M 2001/0032; H03K 19/0185; G06F 1/266
USPC ................ 323/222, 235, 282–299, 271–276; 327/535–541; 710/304, 305, 306, 100, 710/312
See application file for complete search history.

(56) References Cited

U.S. PATENT DOCUMENTS

| | | | |
|---|---|---|---|
| 6,479,975 B1* | 11/2002 | Plankensteiner | ............................ G01R 19/16519 323/313 |
| 6,747,508 B2* | 6/2004 | Liu | .......................... G05F 3/262 323/315 |
| 8,312,199 B2* | 11/2012 | Johnson | .............. G06F 13/4022 710/16 |
| 9,971,395 B2* | 5/2018 | Chenault | ................ G06F 1/3212 |
| 2014/0101345 A1* | 4/2014 | Ranta | ................... G06F 11/3051 710/16 |

* cited by examiner

*Primary Examiner* — Rajnikant B Patel
(74) *Attorney, Agent, or Firm* — Tuenlap Chan; Charles A. Brill; Frank D. Cimino

(57) ABSTRACT

An integrated circuit (IC) comprises an output and a voltage regulator. The voltage regulator comprises an amplifier having a first input coupled to a reference voltage source and a second input coupled to the output, a first resistor coupled to the output and coupled to a ground terminal, a metal oxide semiconductor field effect transistor (MOSFET) having a gate coupled to an output of the amplifier and a drain coupled to the output, and a second resistor coupled to a source of the MOSFET and coupled to the ground terminal.

21 Claims, 8 Drawing Sheets

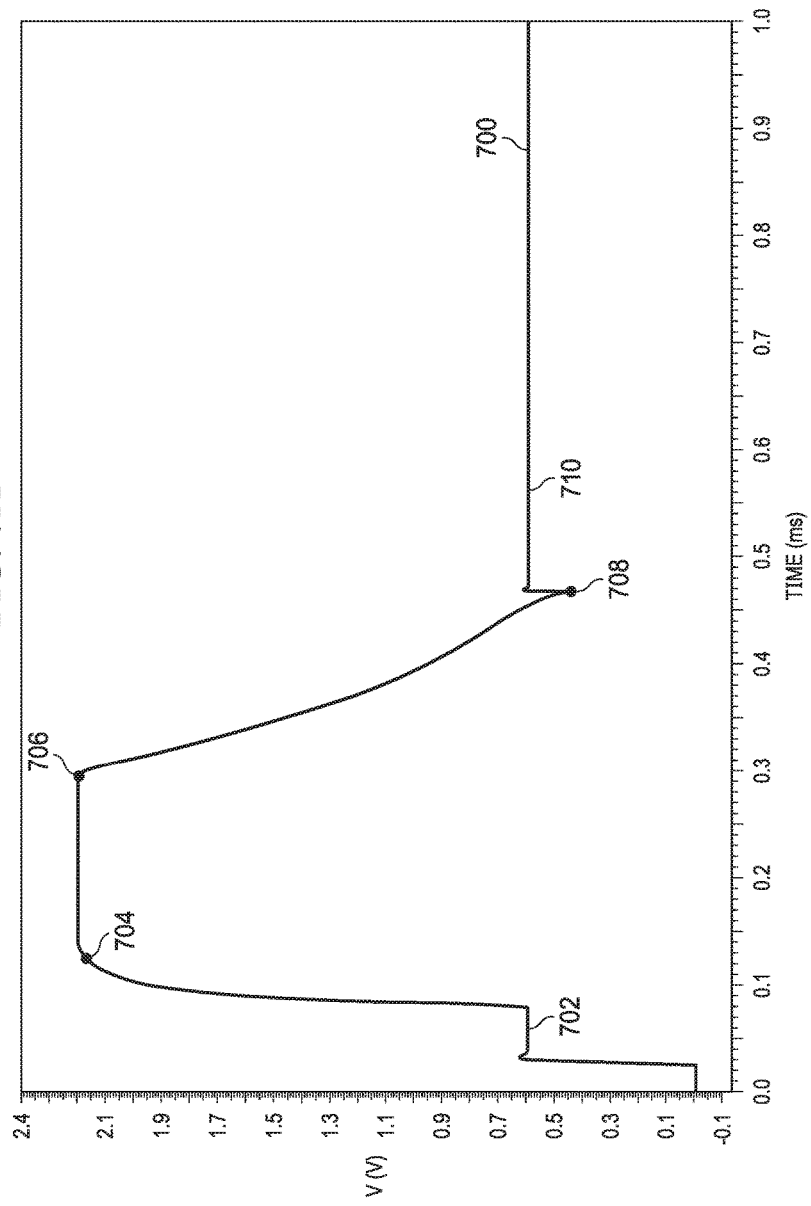

VOLTAGE REGULATOR IN USB POWER DELIVERY INTEGRATED CIRCUIT

BACKGROUND

The design of interfaces between different electronic equipment takes into consideration the expectations and capabilities of the connecting equipment. For example, a data source expects a 50 ohm input impedance, and the receiver interface therefore is designed to present a 50 ohm input impedance. Various problems can occur if these expectations are not met, a condition known as impedance mismatch. For example, if an electronic circuit is connected to a receiver having a lower input impedance than expected, the electronic circuit may not be able to drive sufficient current into the receiver and accurate signal transmission can be degraded.

SUMMARY

In accordance with at least one example of the disclosure, an integrated circuit (IC) comprises an output and a voltage regulator. The voltage regulator comprises an amplifier having a first input coupled to a reference voltage source and a second input coupled to the output, a first resistor coupled to the output and coupled to a ground terminal, a metal oxide semiconductor field effect transistor (MOSFET) having a gate coupled to an output of the amplifier and a drain coupled to the output, and a second resistor coupled to a source of the MOSFET and coupled to the ground terminal.

In accordance with at least one example of the disclosure, an electronic system, comprises a universal serial bus (USB) connector and an integrated circuit (IC) coupled to the USB connector, wherein the IC comprises a voltage regulator. The voltage regulator comprises an amplifier having a first input coupled to a reference voltage source and a second input coupled to an output of the IC, a first resistor coupled to the output of the IC and coupled to a ground terminal, a first metal oxide semiconductor field effect transistor (MOSFET) having a gate coupled to an output of the amplifier and a drain coupled to the output of the IC, a second MOSFET having a gate coupled to the output of the amplifier and a source coupled to a source of the first MOSFET, and a second resistor coupled to the source of the first MOSFET and coupled to the ground terminal.

In accordance with at least one example of the disclosure, a method of providing a dual-mode universal serial bus (USB) version signature comprises operating a first metal oxide semiconductor field effect transistor (MOSFET) of a voltage regulator circuit in a triode operation mode when a pull-down load is connected to the voltage regulator, providing a reference voltage to the pull-down load by the voltage regulator circuit when the first MOSFET is operating in the triode operation mode, providing an output impedance of less than a first predefined value of resistance to the pull-down load, operating the first MOSFET in a cut-off operation mode when a pull-up voltage greater than the reference voltage is coupled to a positive output of the voltage regulator circuit, and providing an output impedance of more than a second predefined value of resistance when the first MOSFET is operating in the cut-off operation mode, wherein the second predefined value of resistance is greater than the first predefined value of resistance.

In accordance with at least one example of the disclosure, an integrated circuit (IC) comprises an output and a voltage regulator. The voltage regulator includes an amplifier having an inverting input coupled to a reference voltage source and a non-inverting input coupled to the output; a first resistor coupled to the output and coupled to a ground terminal; a p-type metal oxide semiconductor field effect transistor (P-MOSFET) having a gate coupled to an output of the amplifier and a source coupled to the output; and a second resistor coupled to a drain of the P-MOSFET and coupled to the ground terminal.

BRIEF DESCRIPTION OF THE DRAWINGS

For a detailed description of various examples, reference will now be made to the accompanying drawings in which:

FIG. 7A shows another chart of an output voltage of a voltage regulator in accordance with various examples;

DETAILED DESCRIPTION

A universal serial bus (USB) charging scheme generally prescribes power levels of a USB charger signal to a portable device that are safe to draw from a USB port of the USB charger. For example, the USB battery charging specification revision 1.2 (BC1.2) prescribes defined properties that a voltage source should meet to be classified as a standard charger facility or capability. For example, the voltage source is prescribed to provide a nominal 0.6 VDC output with an output current from 250 uA (microamps) to 400 uA into a load capacitance in the range of 1 picofarad (pF) to 600 pF. Providing this voltage source with a low output impedance achieves good phase margin across the range of load capacitances. It is desirable to support both the USB battery charging specification BC1.2 as well as one or more proprietary charging specifications, but the proprietary charging specifications may conflict with BC1.2. In an example, a proprietary charging specification prescribes that the voltage source have a high output impedance to support the ease of raising the output to 2 V (e.g., because a relatively small current driven into a high output impedance can produce a voltage of 2 V). Such a prescription for a high output impedance would conflict with the low output impedance prescription described above. The present disclosure describes a voltage source (e.g., a voltage regulator) that includes a metal oxide semiconductor field effect transistor (MOSFET) that, along with other circuit elements, is able to satisfy both the USB battery charging specification BC1.2 as well as proprietary charging specifications.

Figure 1:
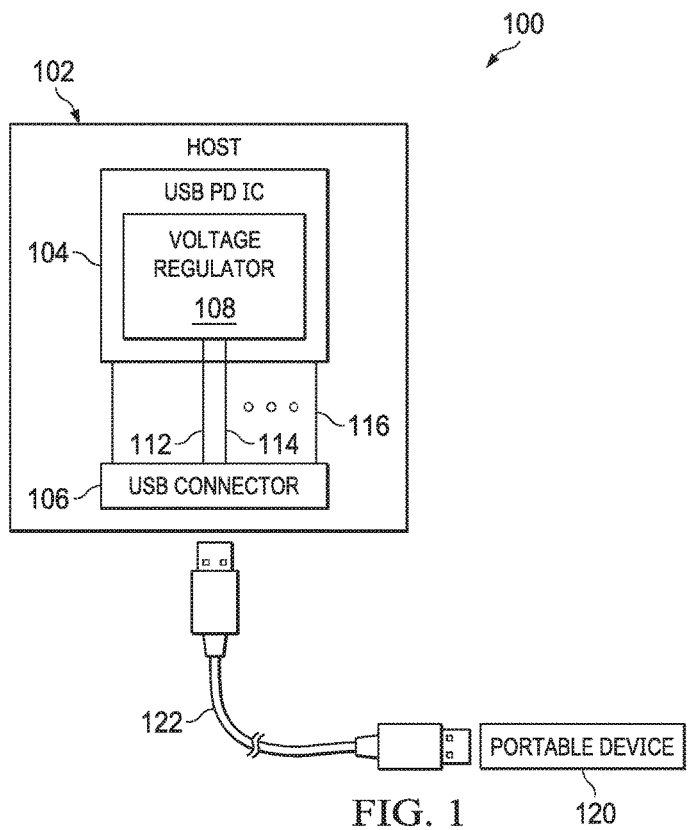
FIG. 1 shows a system in accordance with various examples.

FIG. 1 illustrates an electrical system 100 comprising a USB charging host 102, a portable electronic device 120, and a USB cable 122. In examples, the USB charging host 102 is a laptop computer, a desktop computer, a USB wall charger, a USB car charger, or a docking station for a portable electronic device. The host 102 comprises a USB power delivery integrated circuit (USB PD IC) 104, and a USB connector 106. The USB PD IC 104 comprises a voltage regulator 108. In an example, the voltage regulator 108 is a class-A voltage regulator. A class-A voltage regulator provides a regulated output voltage in a class-A mode of operation (e.g., an always on mode of operation, an always conducting mode of operation). A regulated voltage typically provides a nominal voltage that remains within a predefined range of values when a standard load is coupled to the regulated voltage output, for example, a load that satisfies a predefined specification of capacitance and resistance.

The USB PD IC 104 is coupled to the USB connector 106 by two or more conductors 116, for example, data communication lines. The voltage regulator 108 is connected to the USB connector 106 by a first conductor 112 and a second conductor 114. The conductors 112, 114 are among the conductors 116 but are shown separately to illustrate a specific, example communication coupling from the voltage regulator 108 to the USB connector 106. In an example, an output of the voltage regulator 108 is relied upon by the portable device 120 to identify a type of USB charging device that it is connected to via the cable 122. In an example, an output characteristic of the voltage regulator 108 is used by the portable device 120 to identify that a proprietary charging standard is supported by the USB PD IC 104, the USB connector 106, and/or the USB charging host 102.

In an example, the voltage regulator 108 is a dual-mode device that is configured to provide two different USB version signatures to external devices, for example to the portable device 120. When a first portable device 120 that is compliant with a first USB version signature is connected to the USB connector 106 via the USB cable 122, the voltage regulator 108 presents a first USB version signature to the first portable device 120. When a second portable device 120 that is compliant with a second USB version signature is connected to the USB connector 106 via the USB cable 122, the voltage regulator 108 presents a second USB version signature to the second portable device 120. A version signature is an output characteristic of the voltage regulator 108, for example an output impedance and/or an output voltage. A portable device is compliant with a version signature when it is configured to work with a USB PD IC 104 of that version signature. A portable device is compliant with a version signature when it is compatible with the USB version associated with that version signature.

Figure 2:
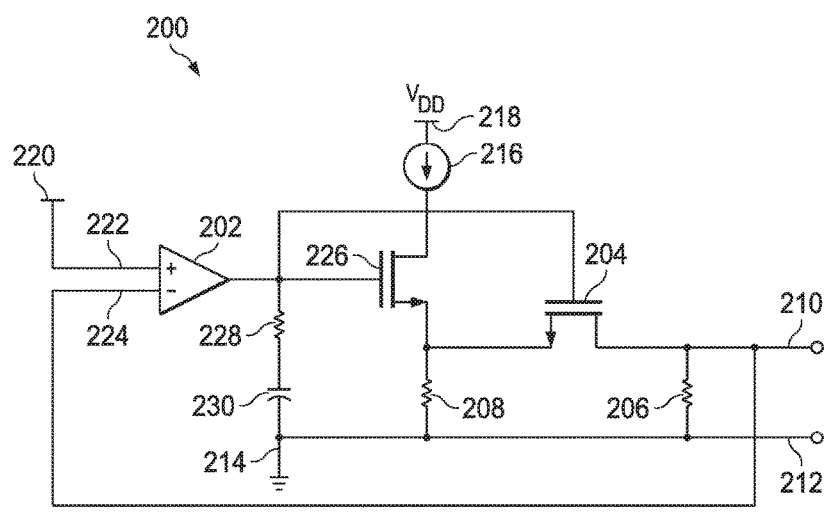
FIG. 2 shows a voltage regulator in accordance with various examples.

FIG. 2 illustrates a voltage regulator 200. In an example, the voltage regulator 200 is a class-A voltage regulator. In an example, the voltage regulator 200 is suitable for use as the voltage regulator 108 in the USB PD IC 104 described above with reference to FIG. 1. In one implementation, the regulator 200 comprises an amplifier 202, a first metal oxide semiconductor field effect transistor (MOSFET), for example a first n-channel MOSFET (NMOSFET) 204, a first resistor 206, a second resistor 208, a positive output 210, a ground output 212, a ground terminal 214, an electrical current source 216, a supply voltage source 218, a reference voltage source 220, a noninverting input lead 222 of the amplifier 202, an inverting input lead 224 of the amplifier 202, a second MOSFET, for example a second NMOSFET 226, a third resistor 228, and a capacitor 230. In an example, the amplifier 202 is an operational amplifier. The positive output 210 and the ground output 212 are outputs of the voltage regulator 200. The outputs 210, 212 correspond to conductors 112, 114 of FIG. 1.

The non-inverting input lead 222 of the amplifier 202 is coupled to the reference voltage source 220. The reference voltage source 220 provides a voltage reference that is set to different values in different examples. The voltage of the reference voltage source 220 establishes the regulated output voltage of the regulator 200 in one operation mode. In an example, the reference voltage source 220 provides a nominal 0.6 volt reference, for example, a voltage between 0.54 volts and 0.66 volts. The inverting input lead 224 of the amplifier 202 is coupled to the positive output 210. An output of the amplifier 202 is coupled to a gate of the first NMOSFET 204, a gate of the second NMOSFET 226, and to a first lead of the third resistor 228.

A drain of the first NMOSFET 204 is coupled to the positive output 210, and a source of the first NMOSFET 204 is coupled to a source of the second NMOSFET 226 and to a first lead of the second resistor 208. A first lead of the first resistor 206 is coupled to the positive output 210, and a second lead of the first resistor 206 is coupled to the ground output 212. A second lead of the second resistor 208 is coupled to the ground output 212. A second lead of the third resistor 228 is coupled to a first lead of the capacitor 230, and a second lead of the capacitor 230 is coupled to the ground terminal 214 and to the ground output 212. An input lead of the current source 216 is coupled to the supply voltage source 218, and an output lead of the current source 216 is coupled to a drain of the second NMOSFET 226. In an example, the voltage regulator 200 differs in some ways from how it is illustrated in FIG. 2.

In a first operation mode, a pull-up voltage is applied across the positive output 210 and to the ground output 212 by an external device coupled to the voltage regulator 200, for example the portable device 120 illustrated in FIG. 1. For example, a voltage that is greater than the voltage of the reference voltage source 220 is provided to the positive output 202 and to the ground output 212. Because the pull-up voltage is greater than the voltage of the reference voltage source 220, the amplifier 202 output is strongly negative, biasing the first NMOSFET 204 OFF (e.g., in cut-off mode). The first NMOSFET 204 is biased OFF when the gate-to-source voltage is less than a turn-on voltage ($V_{GS} < V_T$). When the first NMOSFET 204 is biased OFF, the drain to source channel of the NMOSFET 204 presents a very high resistance, and the output impedance of the regulator 200 is determined by the resistance of the first resistor 206 (e.g., in the first operation mode, the voltage regulator 200 presents a high output impedance). In an example, the first resistor 206 has a resistance greater than 100 kOhms and less than 500 kOhms. In an example, the first resistor 206 has a resistance greater than 150 kOhms and less than 500 kOhms. In an example, the first resistor 206 has a resistance greater than 170 kOhms and less than 500 kOhms. In an example, the first resistor 206 has a resistance greater than 100 kOhms and less than 1 Mega Ohms. In an example, the output impedance provided by the regulator 200 in the first operation mode (e.g., in which the first NMOSFET 204 is OFF) is greater than 150 kOhms and less than 500 kOhms. The first operation mode provides a first signature to an external device (e.g., the portable device 120) by providing a high output impedance that supports the ease of raising a voltage on the positive output 210 above the voltage provided by the voltage reference source 220. Said in other words, the first mode of operation signals the ability of the USB PD IC 104 to support an external device configured to work with a proprietary charging specification.

In a second operation mode, a load is coupled to the positive output 210 and to the ground output 212 (e.g., a voltage is not driven into the output 210, 212 and the voltage across the outputs 210, 212 is determined by the voltage regulator 200). In an example, the load is provided by an external device (e.g., the portable device 120 configured to work with the USB battery charging specification BC 1.2). The amplifier 202 outputs a positive value that biases the first NMOSFET 204 in the triode region (e.g., fully ON). An NMOSFET is biased in the triode region when the gate-to-source voltage of the NMOSFET is above a first threshold voltage and the drain-to-source voltage of the NMOSFET is less than the difference between the gate-to-source voltage and the first threshold voltage (e.g., $V_{GS} > V_{TH1}$ and $V_{DS} < [V_{GS} - V_{TH1}]$). The amplifier 202 also biases the second NMOSFET 226 at least partially ON (e.g., the second NMOSFET 226 operates in the sub-threshold operation mode or in the sub-threshold region) to promote current from the current source 216 flowing through the drain-to-source channel of the second NMOSFET 226, through the second resistor 208, through the drain-to-source channel of the first NMOSFET 204, and through the first resistor 206. An NMOSFET is biased in the sub-threshold region when the gate-to-source voltage is less than the first threshold voltage and greater than a second threshold voltage (e.g., $V_{TH1} > V_{GS} > V_{TH2}$). An NMOSFET is biased OFF when the gate-to-source voltage is less than the second threshold voltage (e.g., $V_{GS} < V_{TH2}$). For different NMOSFETs, different values of the first voltage threshold and the second voltage threshold may apply.

The amplifier 202 modulates its output so that the second NMOSFET 226 flows current through to the second resistor 208, through the drain-to-source channel of the first NMOSFET 204, and through the first resistor 206 to raise the voltage at the positive output 210 to nominally 0.6 volts, for example, between 0.54 volts and 0.66 volts. When fully ON, the first NMOSFET 204 presents very little drain-to-source resistance.

In this second mode of operation, the output impedance is determined by the parallel combination of the first resistor 206 and the second resistor 208. In an example, the resistance of the second resistor 208 is low relative to the resistance of the first resistor 206, and hence the output impedance is determined mainly by the low resistance of the second resistor 208 (e.g., the output impedance is low). In an example, the resistance of the second resistor 208 is less than 40 kOhms and greater than 5 kOhms. In an example, the resistance of the second resistor 208 is less than 30 kOhms and greater than 5 kOhms. In an example, the resistance of the second resistor 208 is less than 20 kOhms and greater than 5 kOhms. In an example, the resistance of the second resistor 208 is less than 15 kOhms and greater than 5 kOhms. In an example, the resistance of the second resistor 208 is less than 10 kOhms and greater than 5 kOhms. In an example, the resistance of the first resistor 206 is about 190 kOhms and the resistance of the second resistor 208 is about 20 kOhms. In an example, the ratio of the resistance of the first resistor 206 to the resistance of the second resistor 208 is greater than 7:1 and less than 30:1. In an example, the ratio of the resistance of the first resistor 206 to the resistance of the second resistor 208 is greater than 9:1 and less than 30:1. In an example, the output impedance provided by the regulator 200 in the second operation mode is greater than 5 kOhms and less than 30 kOhms.

The third resistor 228 and the capacitor 230 are selected to achieve stability of the voltage regulator 200, for example, providing at least a 30 degree phase margin with a 0 A, 600 pF load at the outputs 210, 212. In an example, the low output impedance of the second mode of operation results in a high-frequency output pole, making stabilization of the feedback loop easier, where the feedback loop extends from the positive output 210 to the inverting input lead 224 of the amplifier 202, to the gate of the second NMOSFET 226. In an example, the capacitor 230 can be chosen to have a lower capacitance because of the high-frequency output pole. A capacitor having lower capacitance consumes less area on the die of an integrated circuit comprising the voltage regulator 200, for example the USB PD IC 104. In an example, the supply voltage source 218 is about 3 volts. In an example, the current supplied by the current source 216 is between 200 uA (microamps) and 500 uA.

Figure 3:
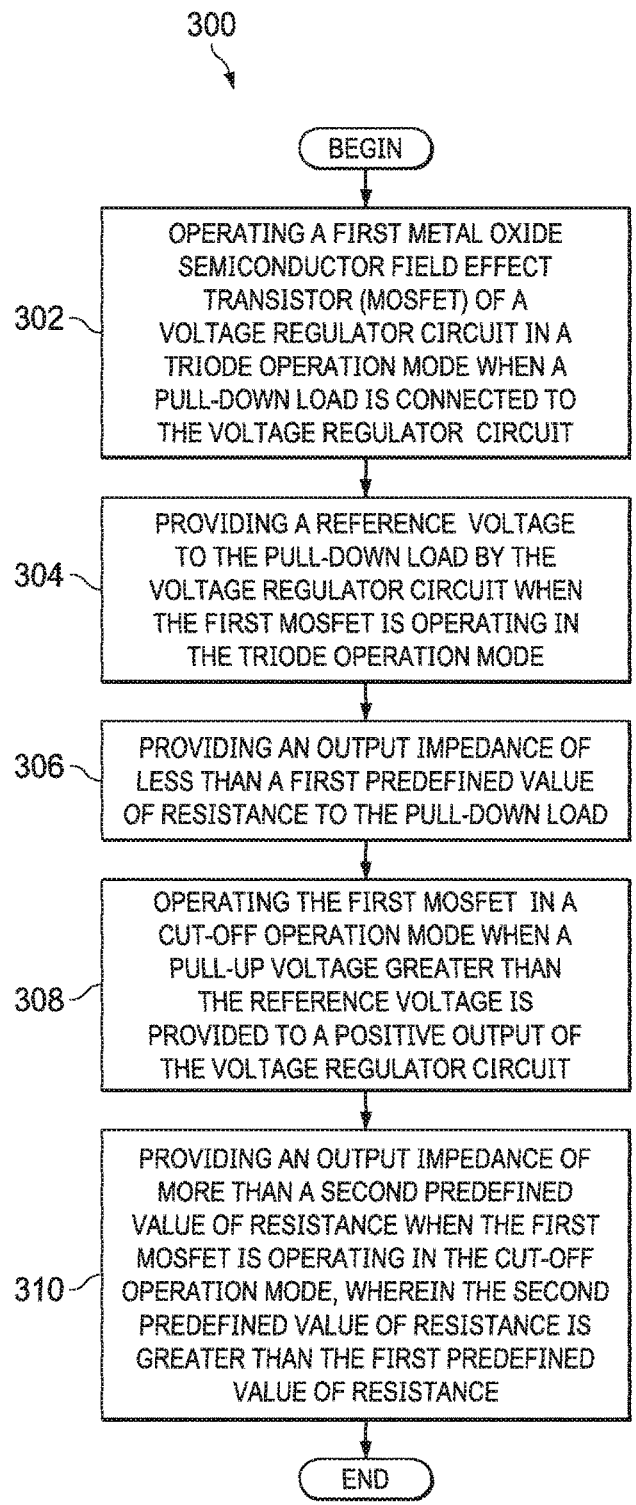
FIG. 3 shows a flow chart of a method in accordance with various examples.

FIG. 3 is a flow chart of a method 300. In an example, the actions of the method 300 may be performed by the voltage regulator 200 described above with reference to FIG. 2. The actions of the method 300 are not necessarily performed in the order illustrated or in any particular sequence; for example, the actions in blocks 308 and 310 may be performed prior to or after the actions in blocks 302, 304, and 306. At block 302, the method 300 comprises operating a first metal oxide semiconductor field effect transistor (MOSFET) of a voltage regulator in a triode operation mode when a pull-down load is connected to the voltage regulator. At block 304, the method 300 comprises providing a reference voltage to the pull-down load by the voltage regulator when the first MOSFET is operating in the triode operation mode. At block 306, the method 300 comprises providing an output impedance of less than 30 kOhms to the pull-down load. At block 308, the method 300 comprises operating the first MOSFET in a cut-off operation mode when a pull-up voltage that is greater than the reference voltage 220 is provided to the positive output of the voltage regulator. At block 310, the method 300 comprises providing an output impedance of more than 150 kOhms when the first MOSFET is operating in the cut-off operation mode. In an example, the method 300 provides a dual-mode USB version signature to external devices that connect to the voltage regulator 200.

Figure 4:
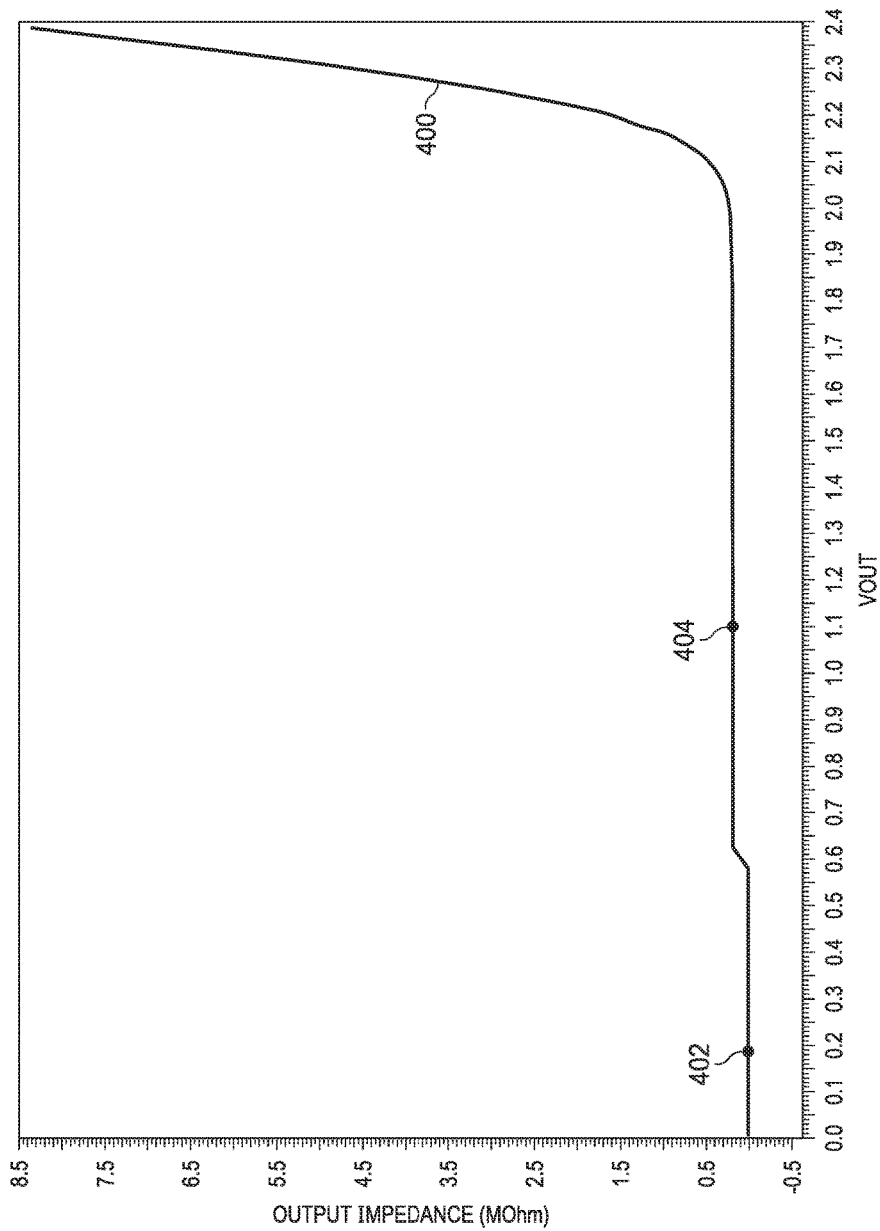
FIG. 4 shows a chart of an output impedance of a voltage regulator in accordance with various examples.

Turning now to FIG. 4, a trace 400 of output impedance versus output voltage of a simulation of the voltage regulator 200 is described. At a first operating point 402 corresponding to the second operation mode where a voltage of less than about 0.6 volts is applied to the output of the voltage regulator 200, the output impedance is substantially constant at about 17.9 K Ohms over a range of voltage values up to about 0.6 volts. As the voltage increases above 0.6 volts, the trace 400 makes an abrupt transition to an output impedance that is substantially constant at about 192 K Ohms over a range of voltage values from about 0.65 volts up to about 2.0 volts. A second operating point 404 corresponds to the first operation mode where a voltage of greater than 0.65 volts is applied to the output of the voltage regulator 200. The abrupt transition corresponds to when the output of the amplifier 202 swings from positive valued to negative valued, turning off the first NMOSFET 204, and causing the output impedance of the voltage regulator 200 to be determined by the first resistor 206. The trace 400 illustrates that the output impedance is relatively small when the output voltage is less than or equal to about 0.6 volts (e.g., the value of the reference voltage source 220) and increases sharply when the output voltage exceeds 0.6 volts.

Figure 5:
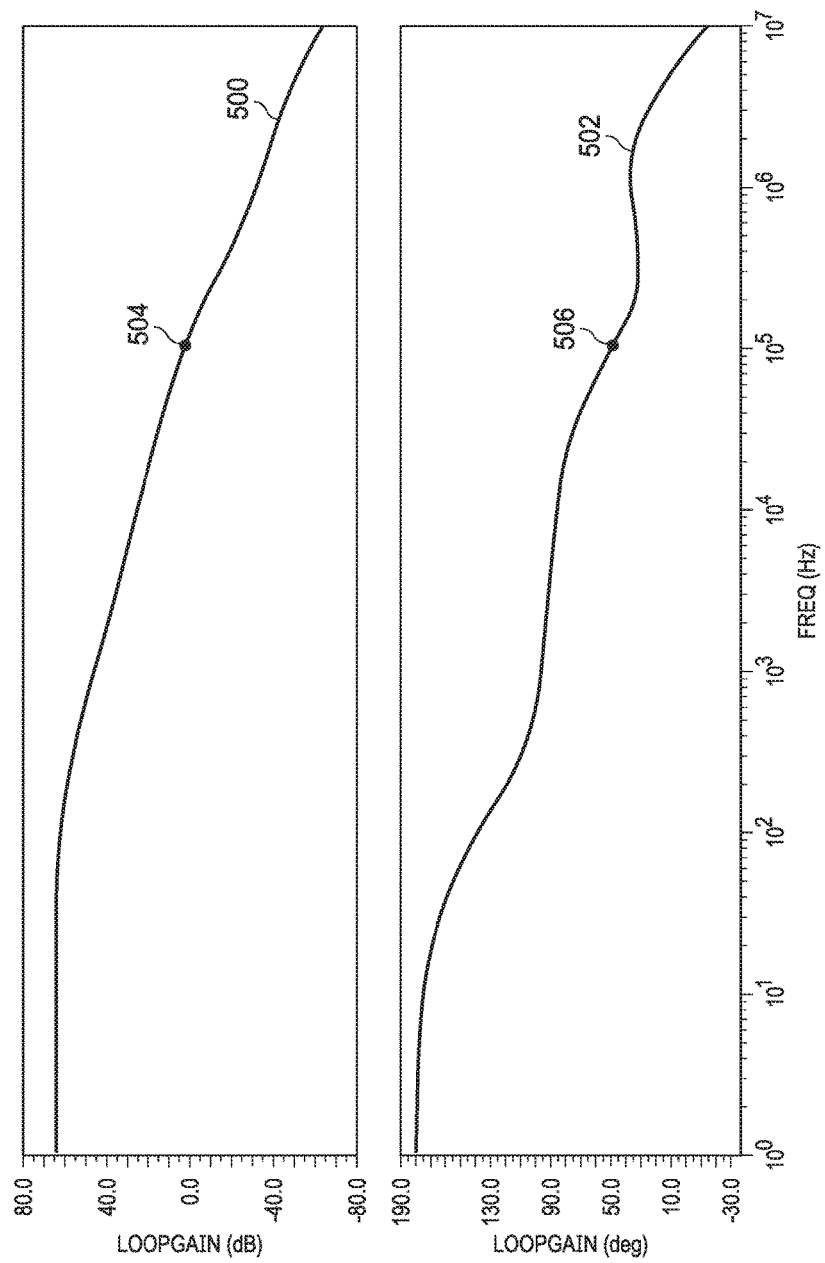
FIG. 5 shows a chart of loop gain versus frequency of a voltage regulator in accordance with various examples.

Turning now to FIG. 5, a trace 500 of the simulated loop gain in decibels versus frequency of the output of the voltage regulator 200 and a trace 502 of the simulated loop gain in degrees versus frequency of the output of the positive output 210 of the voltage regulator 200 while operated in the second operation mode (e.g., when the output voltage is regulated to about 0.6 volts) are described. A phase margin of the voltage regulator 200 is desirably a positive value to achieve stability in the feedback loop from the output 210, 212 through the amplifier 202. Phase margin is determined as the loop gain in degrees at the point where the loop gain in decibels is zero. This condition is met when the frequency is about 100 K Hz. This is point 504 on the trace 500 and point 506 on the trace 502. The phase margin is seen to be about 40 degrees for the simulated voltage regulator 200.

Figure 6:
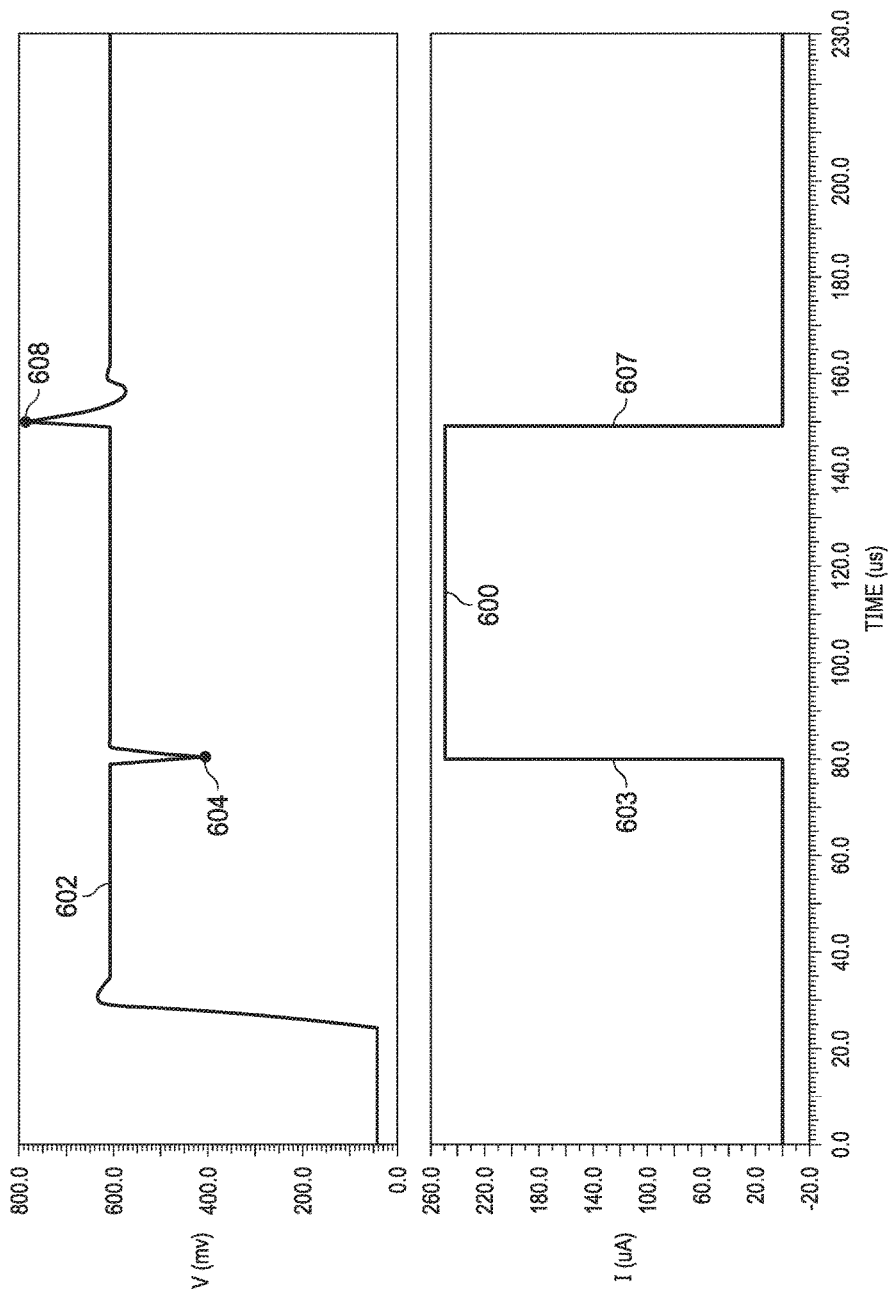
FIG. 6 shows a chart of an output voltage of a voltage regulator in accordance with various examples.

Turning now to FIG. 6, a voltage versus time trace 602 and a current in the positive versus time trace 600 are described. The voltage is the output of the simulated voltage regulator 200 operated in the second operation mode. The current is the current in the positive output 210 of the simulated voltage regulator 200 operated in the second operation mode. A current load of about 250 microamps is applied on the positive output 210 of the simulated voltage regulator 200 at time 80 microseconds and is labeled as transition 603 in trace 600. This current load simulates connecting an external device (e.g., portable device 120) to the voltage regulator 200. The voltage output by the simulated voltage regulator 200 momentarily drops from about 0.6 volts to about 0.38 volts at point 604 and then restores to about 0.6 volts. The current load is removed at time 150 microseconds and is labeled as transition 607 in trace 600. The voltage output by the simulated voltage regulator 200 momentarily rises from about 0.6 volts to about 0.78 volts at point 608 and then restores to about 0.6 volts. This simulation provides an additional verification of the stability of the simulated voltage regulator 200.

Turning now to FIG. 7A, a voltage versus time trace 700 of the simulated voltage regulator 200 is described. After the simulated voltage regulator 200 is powered on in the second operation mode, the output voltage of the simulated voltage regulator 200 stabilizes at about 0.6 volts at point 702. The simulated voltage regulator 200 is then shifted to the first operation mode by applying a voltage of about 2.2 volts through a 20 K Ohm resistance to output 210, 212, and the output voltage stabilizes at point 704. At point 706 of the trace 700, the simulated voltage regulator 200 is shifted back to the second operation mode, and the output voltage drops to about 0.4 volts at point 708 in the trace 700, and then stabilizes at point 710 at about 0.6 volts. The simulation represented by trace 700 is a functional test of the simulated voltage regulator 200.

Figure 7B:
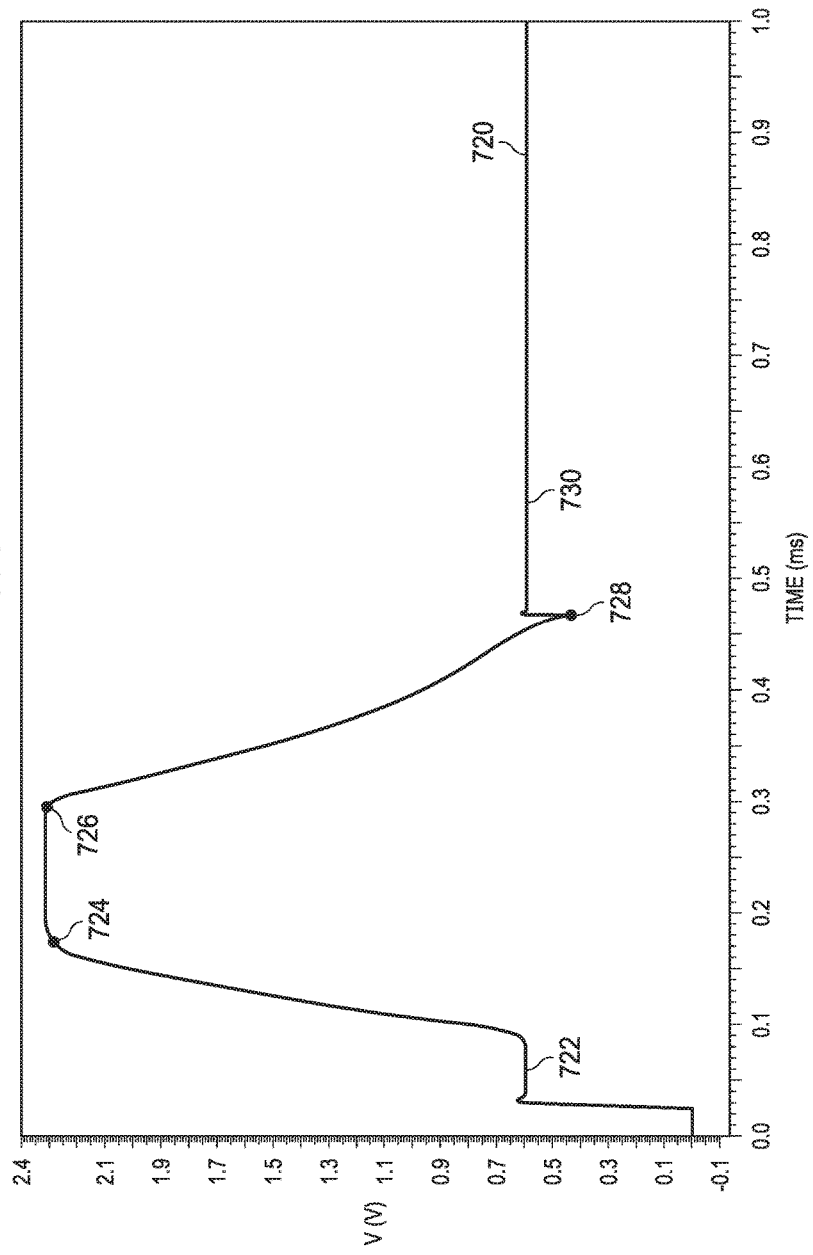
FIG. 7B shows yet another chart of an output voltage of a voltage regulator in accordance with various examples.

Turning now to FIG. 7B, a voltage versus time trace 720 of the simulated voltage regulator 200 is described. After the simulated voltage regulator 200 is powered on in the second operation mode, the output voltage of the simulated voltage regulator 200 stabilizes at about 0.6 volts at point 722. The simulated voltage regulator 200 is then shifted to the first operation mode by applying a voltage of about 2.3 volts via a current source supplying about 22 microamps to output 210, 212, and the output voltage stabilizes at point 724. At point 726 of the trace 720, the simulated voltage regulator 200 is shifted back to the second operation mode, and the output voltage drops to about 0.4 volts at point 728 in the trace 720, and then stabilizes at point 730 at about 0.6 volts. The simulation represented by trace 720 is a functional test of the simulated voltage regulator 200.

Figure 8:
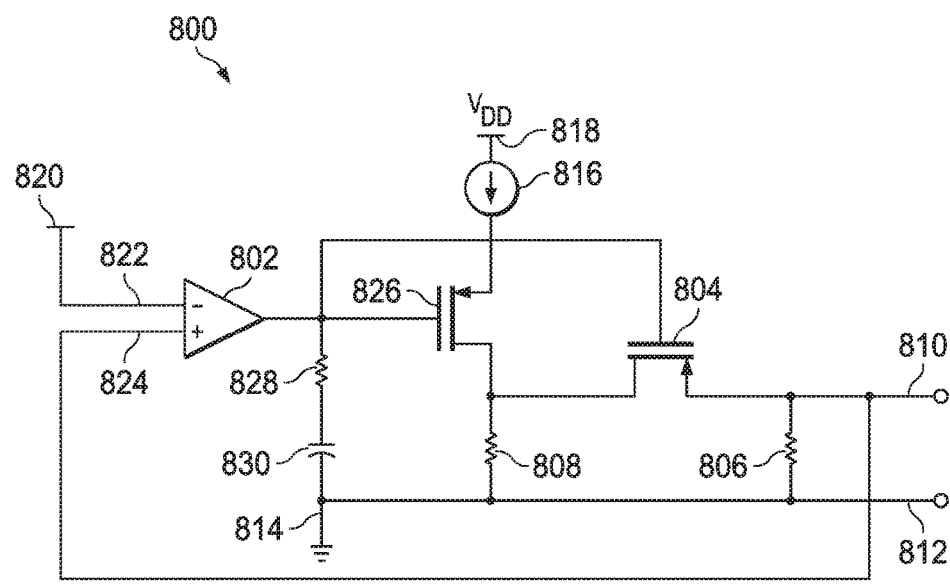
FIG. 8 shows another voltage regulator in accordance with various examples.

Turning now to FIG. 8, a second voltage regulator 800 is described. The second voltage regulator 800 of FIG. 8 is substantially similar to the voltage regulator 200 of FIG. 2, with the NMOSFETs of FIG. 2 replaced with PMOSFETS and the input connections to the amplifier 202 reversed in polarity. In an example, the second voltage regulator 800 is a class-A voltage regulator. In an example, the second voltage regulator 800 is suitable for use as the voltage regulator 108 in the USB PD IC 104 described above with reference to FIG. 1.

In one implementation, the second voltage regulator 800 comprises a second amplifier 802, a first p-channel MOSFET (PMOSFET) 804, a fourth resistor 806, a fifth resistor 808, a second positive output 810, a second ground output 812, a second ground terminal 814, a second electrical current source 816, a second supply voltage source 818, a second reference voltage source 820, a non-inverting input lead 824 of the second amplifier 802, an inverting input lead 822 of the second amplifier 802, a second PMOSFET 826, a sixth resistor 828, and a second capacitor 830. In an example, the second amplifier 802 is an operational amplifier. The second positive output 810 and the second ground output 812 form an output of the second voltage regulator 800. The outputs 810, 812 correspond to conductors 112, 114 of FIG. 1.

The inverting input lead 822 of the second amplifier 802 is coupled to the second reference voltage source 820. The second reference voltage source 820 provides a reference voltage that is set to different values in different examples. The reference voltage of the second reference voltage source 820 establishes the regulated output voltage of the second voltage regulator 800 in one operation mode. In an example, the second reference voltage source 820 provides a nominal 0.6 volt reference, for example, a voltage between 0.54 volts and 0.66 volts. The non-inverting input lead 824 of the second amplifier 802 is coupled to the second positive output 810. An output of the second amplifier 802 is coupled to a gate of the first PMOSFET 804, a gate of the second PMOSFET 826, and to a first lead of the sixth resistor 828.

A source of the first PMOSFET 804 is coupled to the second positive output 810, and a drain of the first PMOSFET 804 is coupled to a drain of the second PMOSFET 826 and to a first lead of the fifth resistor 808. A first lead of the fourth resistor 806 is coupled to the second positive output 810, and a second lead of the fourth resistor 806 is coupled to the second ground output 812. A second lead of the fifth resistor 808 is coupled to the second ground output 812. A second lead of the sixth resistor 828 is coupled to a first lead of the second capacitor 830, and a second lead of the second capacitor 830 is coupled to the second ground terminal 814 and to the second ground output 812. An input lead of the second current source 816 is coupled to the second supply voltage source 818, and an output lead of the second current source 816 is coupled to a source of the second PMOSFET 826. In an example, the second voltage regulator 800 differs in some ways from how it is illustrated in FIG. 8.

In a first operation mode, a pull-up voltage is applied across the second positive output 810 and to the second ground output 812. For example, a voltage that is greater than the reference voltage of the second reference voltage source 820 is provided to the second positive output 810 by an external device (e.g., the portable device 120). Because the pull-up voltage is greater than the reference voltage of the second reference voltage source 820, the second amplifier 802 output is strongly positive, biasing the first PMOSFET 804 OFF. The first PMOSFET 804 is biased OFF when the source-to-gate voltage is less than a turn-on voltage ($V_{SG} < V_T$). When the first PMOSFET 804 is biased OFF, the drain-to-source channel of the PMOSFET 804 presents a very high resistance, and the output impedance of the second voltage regulator 800 is determined by the resistance of the fourth resistor 806 (e.g., in the first operation mode, the second voltage regulator 800 presents a high output impedance). In an example, the fourth resistor 806 has a resistance greater than 100 kOhms and less than 500 kOhms. In an example, the fourth resistor 806 has a resistance greater than 150 kOhms and less than 500 kOhms. In an example, the fourth resistor 806 has a resistance greater than 170 kOhms and less than 500 kOhms. In an example, the fourth resistor 806 has a resistance greater than 100 kOhms and less than 1 Mega Ohms. In an example, the output impedance provided by the second voltage regulator 800 in the first operation mode (e.g., the first PMOSFET 804 OFF) is greater than 150 kOhms and less than 500 kOhms. The first operation mode provides a first signature to an external device (e.g., the portable device 120) by providing a high output impedance that supports the ease of raising a voltage on the positive output 810 above the voltage provided by the voltage reference source 820. Said in other words, the first mode of operation signals the ability of the USB PD IC 104 to support or work with an external device configured to work with a proprietary charging specification.

In a second operation mode, a load is coupled to the second positive output 810 and to the second ground output 812 (e.g., a voltage is not driven into the output 810, 812 and the voltage is determined by the second voltage regulator 800). In an example, the load is provided by an external device (e.g., the portable device 120 configured to work with the USB battery charging specification BC 1.2). The second amplifier 802 outputs a negative value that biases the first PMOSFET 804 in the triode region (e.g., fully ON). A PMOSFET is biased in the triode region when the source-to-gate voltage of the PMOSFET is above a third threshold voltage and the source-to-drain voltage of the PMOSFET is less than the difference between the source-to-gate voltage and the third threshold voltage (e.g., $V_{SG}>V_{TH3}$ and $V_{SD}<[V_{SG}-V_{TH3}]$). The second amplifier 802 also biases the second PMOSFET 826 at least partially ON (e.g., the second PMOSFET 826 operates in the sub-threshold operation mode or in the sub-threshold region) to promote current from the current source 816 flowing through the drain-to-source channel of the second PMOSFET 826, through the fifth resistor 808, through the drain-to-source channel of the first PMOSFET 804, and through the fourth resistor 806. A PMOSFET is biased in the sub-threshold region when the source-to-gate voltage is less than the third threshold voltage and greater than a fourth threshold voltage (e.g., $V_{TH3}>V_{SG}>V_{TH4}$). A PMOSFET is biased OFF (e.g., cut-off mode) when the source-to-gate voltage is less than the fourth threshold voltage (e.g., $V_{SG}<V_{TH4}$). For different PMOSFETs, different values of the third voltage threshold and the fourth voltage threshold may apply.

The second amplifier 802 modulates its output so that the second PMOSFET 826 flows current through to the fifth resistor 808, through the drain-to-source channel of the first PMOSFET 804, and through the fourth resistor 806 to raise the voltage at the second positive output 810 to nominally 0.6 volts, for example, between 0.54 volts and 0.66 volts. When fully ON, the first PMOSFET 804 presents very little drain-to-source resistance.

In this second mode of operation, the output impedance is determined by the parallel combination of the fourth resistor 806 and the fifth resistor 808. In an example, the resistance of the fifth resistor 808 is low relative to the resistance of the fourth resistor 806, and hence the output impedance is determined mainly by the low resistance of the fifth resistor 808 (e.g., the output impedance is low). In an example, the resistance of the fifth resistor 808 is less than 40 kOhms and greater than 5 kOhms. In an example, the resistance of the fifth resistor 808 is less than 30 kOhms and greater than 5 kOhms. In an example, the resistance of the fifth resistor 808 is less than 20 kOhms and greater than 5 kOhms. In an example, the resistance of the fifth resistor 808 is less than 15 kOhms and greater than 5 kOhms. In an example, the resistance of the fifth resistor 808 is less than 10 kOhms and greater than 5 kOhms. In an example, the resistance of the fourth resistor 806 is about 190 kOhms and the resistance of the fifth resistor 808 is about 20 kOhms. In an example, the ratio of the resistance of the fourth resistor 806 to the resistance of the fifth resistor 808 is greater than 7:1 and less than 30:1. In an example, the ratio of the resistance of the fourth resistor 806 to the resistance of the fifth resistor 808 is greater than 9:1 and less than 30:1. In an example, the output impedance provided by the second voltage regulator 800 in the second operation mode is greater than 5 kOhms and less than 30 kOhms.

The sixth resistor 828 and the second capacitor 830 are selected to achieve stability of the second voltage regulator 800, for example, providing at least a 30 degree phase margin with a 0 A, 600 pF load at the outputs 810, 812. In an example, the low output impedance of the second mode of operation results in a high-frequency output pole, making stabilization of the feedback loop easier, where the feedback loop extends from the second positive output 810 to the non-inverting input lead 824 of the second amplifier 802, to the gate of the second PMOSFET 826. In an example, the second supply voltage source 818 is about 3 volts. In an example, the current supplied by the second current source 816 is between 200 uA (microamps) and 500 uA.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means+/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. An integrated circuit (IC), comprising:
an output; and
a voltage regulator comprising:
an amplifier having a first input coupled to a reference voltage source and a second input coupled to the output;
a first resistor coupled to the output and coupled to a ground terminal;
a metal oxide semiconductor field effect transistor (MOSFET) having a gate coupled to an output of the amplifier and a drain coupled to the output; and
a second resistor coupled to a source of the MOSFET and coupled to the ground terminal.

2. The IC of claim 1, wherein the IC is a universal serial bus power delivery IC (USB PD IC).

3. The IC of claim 1, wherein the MOSFET is an n-channel MOSFET (NMOSFET).

4. The IC of claim 1, wherein the voltage regulator comprises a second MOSFET having a gate coupled to the output of the amplifier and having a source coupled to the source of the MOSFET and to the second resistor.

5. The IC of claim 4, wherein the voltage regulator comprises a current source having an input coupled to a supply voltage source and an output coupled to a drain of the second MOSFET.

6. The IC of claim 5, wherein the voltage regulator comprises a third resistor and a capacitor, wherein the third resistor is coupled to the output of the amplifier and to the capacitor and the capacitor is coupled to the ground terminal.

7. The IC of claim 1, wherein the resistance of the first resistor is greater than 150 kOhms and less than 500 kOhms and the resistance of the second resistor is greater than 5 kOhms and less than 30 kOhms.

8. An electronic system, comprising:
a universal serial bus (USB) connector; and
an integrated circuit (IC) coupled to the USB connector, wherein the IC comprises
a voltage regulator, wherein the voltage regulator comprises:
an amplifier having a first input coupled to a reference voltage source and a second input coupled to an output of the IC;
a first resistor coupled to the output of the IC and coupled to a ground terminal;
a first metal oxide semiconductor field effect transistor (MOSFET) having a gate coupled to an output of the amplifier and a drain coupled to the output of the IC;
a second MOSFET having a gate coupled to the output of the amplifier and a source coupled to a source of the first MOSFET; and
a second resistor coupled to the source of the first MOSFET and coupled to the ground terminal.

9. The electronic system of claim 8, wherein the electronic system is selected from the group consisting of: a laptop computer, a personal computer, a car charger, a wall charger, and a docking station for a portable electronic device.

10. The electronic system of claim 8, wherein the voltage regulator is to provide an output impedance greater than 150 kOhms when configured in a first operation mode and is to provide an output impedance less than 30 kOhms when configured in a second operation mode.

11. The electronic system of claim 10, wherein the electronic system is configured in the first operation mode when a source configured to connect to an output impedance greater than 150 kOhms and to raise the voltage of the output of the voltage regulator to 2 volts is coupled to the USB connector and the electronic system is configured in the second operation mode when a USB battery charging specification version 1.2 compliant electronic device is coupled to the USB connector.

12. The electronic system of claim 8, wherein the voltage regulator comprises a current source having an input coupled to a supply voltage source and an output coupled to a drain of the second MOSFET.

13. The electronic system of claim 8, wherein the reference voltage source is to provide a voltage reference of between 0.54 volts and 0.66 volts.

14. A method of providing a dual-mode universal serial bus (USB) version signature, comprising:
operating a first metal oxide semiconductor field effect transistor (MOSFET) of a voltage regulator circuit in a triode operation mode when a pull-down load is connected to the voltage regulator;
providing a reference voltage to the pull-down load by the voltage regulator circuit when the first MOSFET is operating in the triode operation mode;
providing an output impedance of less than a first predefined value of resistance to the pull-down load;
operating the first MOSFET in a cut-off operation mode when a pull-up voltage greater than the reference voltage is coupled to a positive output of the voltage regulator circuit; and
providing an output impedance of more than a second predefined value of resistance when the first MOSFET is operating in the cut-off operation mode, wherein the second predefined value of resistance is greater than the first predefined value of resistance.

15. The method of claim 14, wherein the reference voltage provided to the pull-down load is between 0.54 volts and 0.66 volts.

16. The method of claim 14, comprising biasing the first MOSFET in the triode operation mode by an amplifier of the voltage regulator circuit when the pull-down load is connected to the voltage regulator circuit.

17. The method of claim 16, comprising providing between 0.54 volts and 0.66 volts to a non-inverting input of the amplifier and providing feedback from a positive output of the voltage regulator circuit to an inverting input of the amplifier when the pull-down load is connected to the voltage regulator circuit.

18. The method of claim 16, comprising:
biasing a second MOSFET of the voltage regulator circuit to operate in the sub-threshold operation mode by the amplifier; and
flowing current output by a current source of the voltage regulator circuit through a drain-to-source channel of the second MOSFET and through a second resistor of the voltage regulator circuit that is coupled to a source of the first MOSFET, coupled to a source of the second MOSFET, and coupled to a ground terminal, wherein the gate of the first MOSFET and the gate of the second MOSFET are coupled to an output of the amplifier.

19. The method of claim 18, wherein the resistance of the second resistor is between 5 kOhms and 30 kOhms and wherein the resistance of the first resistor is between 150 kOhms and 500 kOhms.

20. The method of claim 18, wherein the first MOSFET and the second MOSFET are n-channel MOSFETs (NMOSFETs).

21. An integrated circuit (IC), comprising:
an output; and
a voltage regulator comprising:
- an amplifier having an inverting input coupled to a reference voltage source and a non-inverting input coupled to the output;
- a first resistor coupled to the output and coupled to a ground terminal;
- a p-type metal oxide semiconductor field effect transistor (P-MOSFET) having a gate coupled to an output of the amplifier and a source coupled to the output; and
- a second resistor coupled to a drain of the P-MOSFET and coupled to the ground terminal.

* * * * *